United States Patent
Arabaci et al.

(10) Patent No.: US 8,719,656 B2
(45) Date of Patent: May 6, 2014

(54) FOUR-DIMENSIONAL NON-BINARY LDPC-CODED MODULATION SCHEMES FOR ULTRA HIGH-SPEED OPTICAL FIBER COMMUNICATION

(75) Inventors: Murat Arabaci, Tucson, AZ (US); Lei Xu, Princeton, NJ (US); Ting Wang, Princeton, NJ (US); Ivan B. Djordjevic, Tucson, AZ (US)

(73) Assignee: NEC Laboratories America, Inc., Princeton, NJ (US)

( * ) Notice: Subject to any disclaimer, the term of this patent is extended or adjusted under 35 U.S.C. 154(b) by 127 days.

(21) Appl. No.: 13/441,808

(22) Filed: Apr. 6, 2012

(65) Prior Publication Data

US 2012/0260142 A1 Oct. 11, 2012

Related U.S. Application Data

(60) Provisional application No. 61/474,045, filed on Apr. 11, 2011.

(51) Int. Cl.
*H03M 13/00* (2006.01)
*H04L 1/18* (2006.01)

(52) U.S. Cl.
USPC .......................................... 714/752; 714/751

(58) Field of Classification Search
None
See application file for complete search history.

(56) References Cited

U.S. PATENT DOCUMENTS

2007/0171714 A1* 7/2007 Wu et al. .................. 365/185.09
2009/0282314 A1* 11/2009 Djordjevic et al. ........... 714/755

OTHER PUBLICATIONS

Rate-Adaptive nonbinary-LDPC-coded modulation with backpropagation for long-haul optical transport networks Arabaci, M. ; Djordjevic, I.B. ; Schmidt, T. ; Saunders, R. ; Marcocci, R.M. Publication Year: 2010 , pp. 1-4.*
Subcarrier-Multiplexed Four-Dimensional LDPC Coded Modulation for High Speed Optical Transmission Systems Hussam G. Batshon, Ivan B. Djordjevic1, Ted Schmidt—2010, IEEE, pp. 399-400.*
Non-binary Hybrid LDPC Codes Lucile Sassatelli and David Declercq, 2008, ETIS—CNRS UMR 8051—ENSEA—University of Cergy-Pontoise, pp. 1-56.*
I. B. Djordjevic, M. Cvijetic, L. Xu, and T. Wang, "Using LDPC-coded modulation and coherent detection for ultra high-speed optical transmission," IEEE/OSA J. Lightwave Technol., vol. 25, pp. 3619-3625, Nov. 2007.
S. J. Savory, "Digital filters for coherent optical receivers," Optics Express, vol. 16, No. 2, pp. 804-817, Jan. 2008.
H. G. Batshon, I. B. Djordjevic, L. Xu, and T. Wang, "Multidimensional LDPC-coded modulation for beyond 400 Gb/s per wavelength transmission," IEEE Photon. Technol. Lett., vol. 21, No. 16, pp. 1139-1141, Aug. 2009.
M. Arabaci, I. B. Djordjevic, R. Saunders, and R. M. Marcoccia, "Nonbinary quasi-cyclic LDPC based coded modulation for beyond 100 Gb/s transmission," IEEE Photon. Technol. Left., vol. 22, No. 6, pp. 434-436, Mar. 2010.

(Continued)

*Primary Examiner* — Guerrier Merant
(74) *Attorney, Agent, or Firm* — Joseph Kolodka

(57) ABSTRACT

Systems and methods are disclosed for communicating signals, by receiving a K-symbol-long input block from a $2^m$-ary source channel; encoding the input block into a $2^m$-ary non-binary low-density parity-check (LDPC) codeword of length N; and mapping each $2^m$-ary symbol to a point in a signal constellation comprised of $2^m$ points, wherein a non-binary LDPC code is used as the component code for forward error correction in a coded modulation scheme capable of achieving optical fiber communication at rates beyond 100 Gb/s.

20 Claims, 2 Drawing Sheets

(56) References Cited

OTHER PUBLICATIONS

H. G. Batshon, I. B. Djordjevic, and T. Schmidt, "Ultra high speed optical transmission using subcarrier-multiplexed four-dimensional LDPC-coded modulation," Optics Express, vol. 18, No. 19, pp. 20546-20551, Sep. 2010.

J. Hou, P. H. Siegel, L. B. Milstein, and H. D. Pfister, "Capacity-approaching bandwidth-efficient coded modulation schemes based on low-density parity-check codes," IEEE Trans. Inform. Theory, vol. 49, No. 9, pp. 2141-2155, Sep. 2003.

H. Bülow and E. Masalkina, "Coded modulation in optical communications," in Proc. OFC, Los Angeles, 2011, paper OThO1.

* cited by examiner

FOUR-DIMENSIONAL NON-BINARY LDPC-CODED MODULATION SCHEMES FOR ULTRA HIGH-SPEED OPTICAL FIBER COMMUNICATION

This application claims priority to Provisional Application Ser. No. 61/474,045, filed Apr. 11, 2011, the content of which is incorporated by reference.

The present invention relates to modulation schemes for optical fiber communication.

BACKGROUND

The IEEE 802.3ba standard on 40/100 Gigabit Ethernet (40/100 GbE) was ratified in June 2010 as a response to the ever-increasing demands for higher capacity transmission over optical fiber links. Discussions over the next upgrade for Ethernet have already started. While some argue that 1 Terabit Ethernet (TbE) should be standardized next to meet the projected demand, some advocate taking a more conservative step with an intermediary upgrade to 400 GbE. Regardless of such projections, all agree that the enormous growth in Ethernet traffic will render higher capacity transmission inevitable, and 100 GbE is just another station but not the final destination in the evolution of Ethernet.

As the operating symbol rates increase, the deteriorating effects of fiber nonlinearities and polarization-mode dispersion (PMD) reach levels that inhibit reliable communication over the optical fiber network. Thus solutions for 100 GbE and beyond need to attain ultra-high transmission speeds in terms of aggregate bit rates while keeping the operating symbol rates low to facilitate nonlinearity and PMD management. A promising solution employing coded modulation using low-density parity-check (LDPC) codes as component codes has already been discussed in our previous works [1], [2]. The underlying idea is to use spectrally-efficient modulation formats at low symbol rates along with strong LDPC codes for forward error correction (FEC) in order to accomplish reliable communication at high aggregate bit rates.

In addition to spectral efficiency, power efficiency of a modulation format plays an important role in communication system design. Coherent optical communication physically allows using four dimensions for modulation rather than only two dimensions over which conventional modulation formats, e.g., quadrature amplitude modulation, are defined. As a result, one can exploit this four-dimensional (4D) signal space to set up more power-efficient signal constellations than one could do using the 2D signal space—by increasing the Euclidean distance between constellation points for a given average signal power.

SUMMARY

Systems and methods are disclosed for communicating signals, by receiving a K-symbol-long input block from a $2^m$-ary source channel; encoding the input block into a $2^m$-ary non-binary low-density parity-check (LDPC) codeword of length N; and mapping each $2^m$-ary symbol to a point in a signal constellation comprised of $2^m$ points, wherein a non-binary LDPC code is used as the component code for forward error correction in a coded modulation scheme capable of achieving optical fiber communication at rates beyond 100 Gb/s.

Advantages of the preferred embodiments may include one or more of the following. The non-binary LDPC codes for FEC and 4D non-binary LDPC-coded modulation (4D NB-LDPC-CM) scheme can provide larger coding gains than the corresponding 4D BI-LDPC-CM scheme. Furthermore, the 4D NB-LDPC-CM scheme can reduce receiver latency by avoiding costly "turbo-like" iterations between the detection and decoding units, which is essential for acceptable error correction performance in any BI-LDPC-CM scheme. Compared to conventional 4D BI-LDPC-CM schemes, the system differs in the following manner: 1) the set of m binary LDPC encoders are replaced by a single $2^m$-ary LDPC encoder, 2) the block interleaver unit is eliminated, 3) the feedback loop into the maximum a posteriori probability (MAP) detector from the decoding unit is eliminated, and 4) symbol-to-bit and vice versa conversion interfaces are eliminated since the non-binary decoder operates at the symbol level. Although conventional BI-LDPC-CM needs iterative detection and decoding for good performance, the present NB-LDPC-CM scheme completely eliminates this need for a feedback loop, which can help lower the latency and computational complexity at receivers. The system also uses non-binary LDPC codes as component codes in LDPC-coded modulation compared to binary LDPC codes that have been vastly employed in conventional bit-interleaved coded modulation schemes. The use of stronger codes like non-binary LDPC codes improves the achievable net coding gains. Additionally, the system adapts the strength of the component non-binary LDPC code according to constellation in use. Such an adaptive scheme enables us to extract most out of the potentials of the coded modulation approach. The system eliminates the iterative detection and decoding process, and hence helps reduce the latency and computational complexity at the receiver.

DESCRIPTION

Figure 1A:
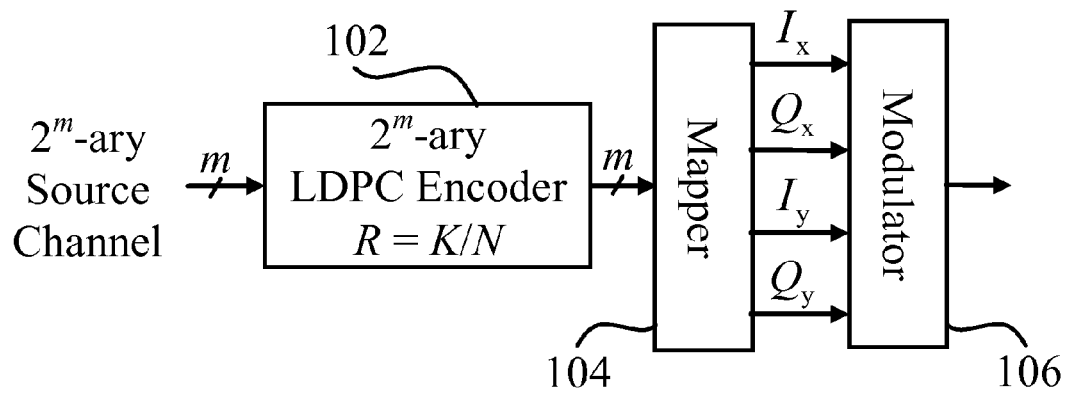
FIGS. 1A-1B show exemplary transmitter and receiver configurations of a system using 4D NB-LDPC-CM scheme.

FIG. 1A shows an exemplary transmitter configuration of a system using 4D NB-LDPC-CM scheme. A $2^m$-ary source channel provides inputs to a $2^m$-ary low-density parity-check (LDPC) encoder 102. The output of the encoder 102 is provided to a mapper 104 that drives a modulator 106.

Figure 1B:
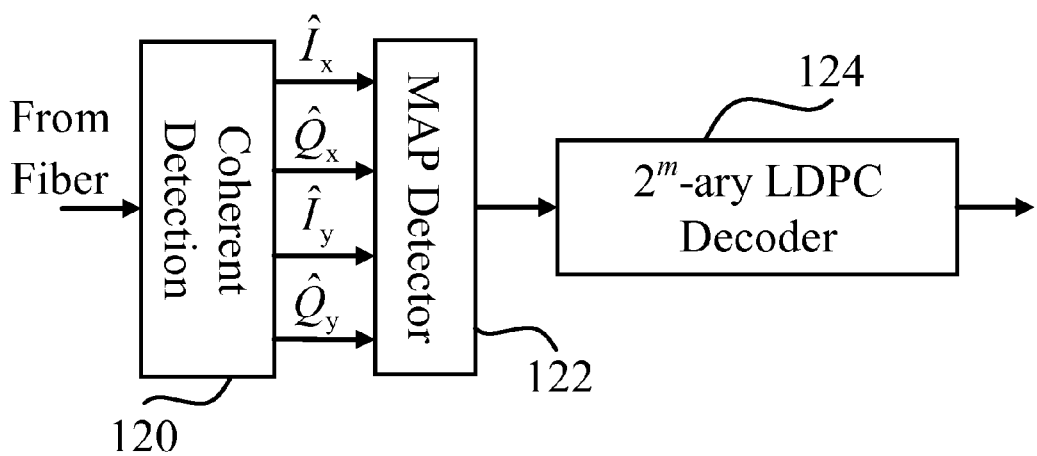

FIG. 1B shows an exemplary receiver configuration of a system using 4D NB-LDPC-CM scheme. A coherent detector 120 receives signals from a fiber and drives a maximum a posteriori (MAP) detector 122. The output of the MAP detector 122 in turn is provided to the $2^m$-ary low-density parity-check (LDPC) decoder 124 corresponding to the encoder 102 at the transmitter.

The transmitter and receiver configurations and the operating principles of the proposed scheme can be described as follows. First of all, a $2^m$-ary, m>1, LDPC(N,K) code is an LDPC code of code rate R=K/N defined over the finite field, or the Galois field, of order $2^m$, denoted by $GF(2^m)$. Since every $2^m$-ary symbol can be represented as a binary vector of length m, m parallel binary source channels can be represented as a single $2^m$-ary channel as in FIGS. 1A-1B, which depict the transmitter and receiver configurations of the proposed 4D NB-LDPC-CM scheme.

In NB-LDPC-CM, an incoming K-symbol-long input block from a $2^m$-ary source channel is encoded into a $2^m$-ary LDPC codeword of length N. The mapper then maps each $2^m$-ary symbol to a point in a signal constellation comprised of $2^m$ points. The order of the field over which the component non-binary LDPC code is designed and the size of the signal constellation are both equal to $2^m$. Since they are equal, there is no need for iterative detection and decoding operation in NB-LDPC-CM. The mapper outputs are then modulated via a 4D optical modulator whose internal structure is depicted in FIG. 2.

At the receiver, the coherent detector outputs on the two quadratures of the two polarizations are passed to the MAP detector. The MAP detector produces the log-likelihood ratio (LLR) matrix of size N×$2^m$. Each row k, 0≤k<N, of the LLR matrix is comprised of $2^m$ entries each corresponding to $$\lambda(s_k^{(a)}) = \log\left[\frac{P(s_k^{(a)}|r)}{P(s_k^{(0)}|r)}\right], \quad (1)$$

i.e., the logarithm of the ratio of the conditional probability that the k-th symbol sent by the transmitter being the 4D constellation point $s_k^{(a)}$ corresponding to the $2^m$-ary symbol a∈GF($2^m$)={0, 1, ..., $2^m$−1} over the probability that it is being $s_k^{(0)}$ given the received noisy vector r. These reliability estimates on each received symbol are then processed by the decoder to determine the codeword sent by the transmitter.

Figure 2:
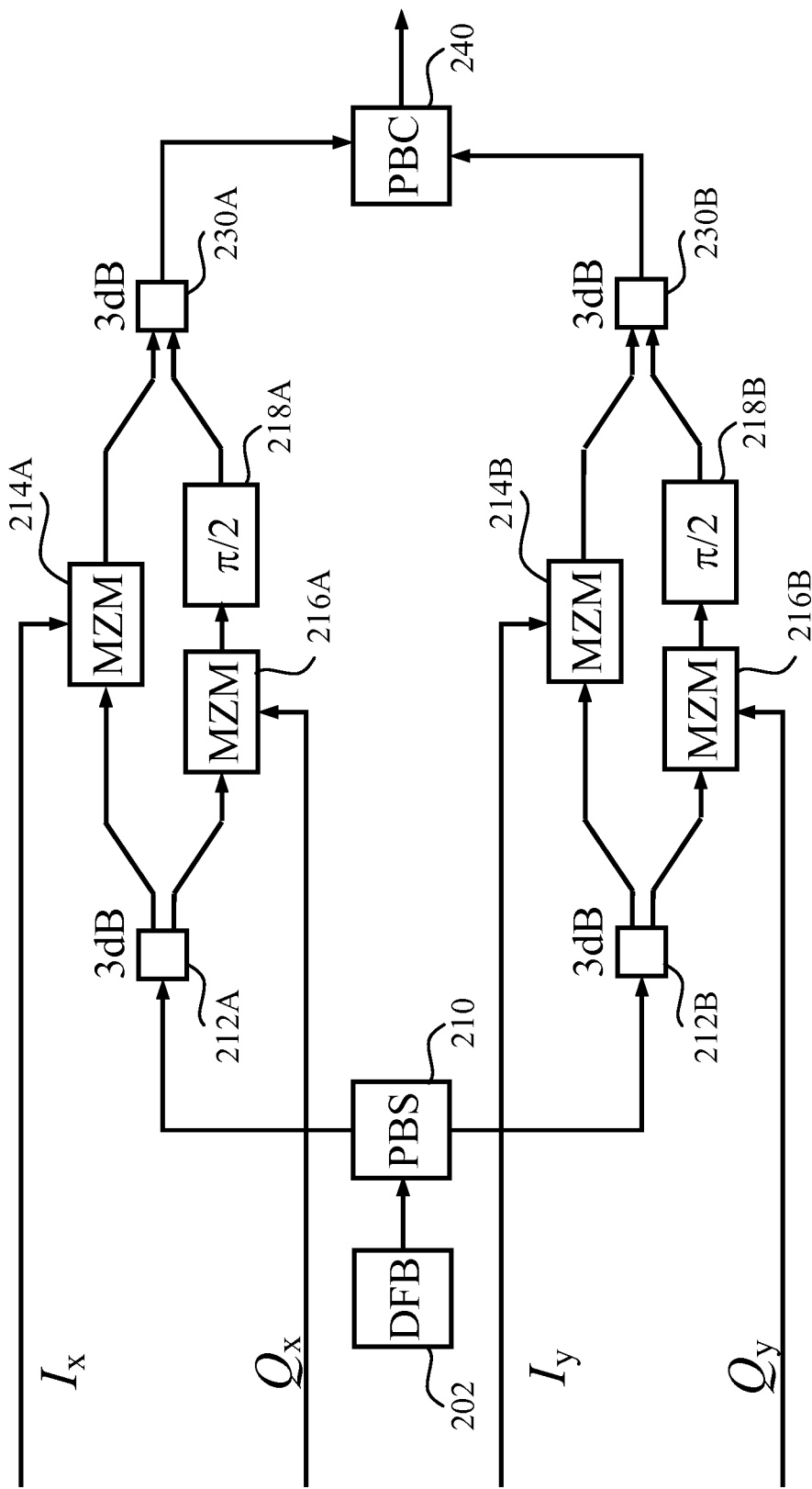
FIG. 2 shows an exemplary 4D modulator.

Referring now to FIG. 2, a distributed feedback laser (DFB) 202 drives a polarization beam splitter (PBS) 210. The outputs of PBS 210 are provided to 3 dB couplers 212A and 212B. Input signals Ix and Qx are provided to Mach-Zehnder modulators (MZMs) 214A and 216A. The output of MZM 216A is provided to a π/2 unit 218A, and a 3 dB coupler 230A receives the output of the MZM 214A and the π/2 unit 218A.

Correspondingly, input signals Iy and Qy are provided to MZMs 214B and 216B. The output of MZM 216B is provided to a π/2 unit 218B, and a 3 dB coupler 230B receives the output of the MZM 214B and the π/2 unit 218B. A polarization beam combiner 240 receives the outputs of the 3 dB couplers 230A and 230B.

The system combines both spectrally-efficient and power-efficient modulation formats with non-binary LDPC codes. High spectral-efficiency enables transmission of many coded bits per transmitted symbol and hence increases the aggregate bit rate when operating at low symbol rates—using low symbol rates facilitates PMD and fiber nonlinearity management. The system utilizes the two quadratures and the two polarizations, which are offered by coherent optical communication, for defining 4D constellations. For a given average signal power, a given number of constellation points can be placed further apart from each other in Euclidean distance sense in a 4D signal space than they could be in a 2D signal space. In other words, the target average Euclidean distance can be achieved for a smaller average signal power over a 4D signal space than over a 2D signal space.

Achieving a more power-efficient scheme helps enormously especially in optical signal-to-noise ratio (OSNR) limited long-haul transmission scenarios. Finally, while increasing the number of constellation points over a given signal space (4D or 2D) in order to increase the number of bits transmitted per symbol and hence to increase aggregate bit rate, one also increases the likelihood of making symbol errors (and thus bit errors) since the symbols get closer and closer to one another. An effective solution that is proposed in this invention is to use non-binary LDPC codes that are designed over the finite field whose order is matched to the size of the underlying signal constellation. Such an approach not only exploits the stronger error correction potential of non-binary LDPC codes over their binary LDPC codes but also adapts the strength of the error correction mechanism according to the signal constellation being used.

Compared to conventional 4D BI-LDPC-CM schemes, the system differs in the following manner: 1) the set of m binary LDPC encoders are replaced by a single $2^m$-ary LDPC encoder, 2) the block interleaver unit is eliminated, 3) the feedback loop into the maximum a posteriori probability (MAP) detector from the decoding unit is eliminated, and 4) symbol-to-bit and vice versa conversion interfaces are eliminated since the non-binary decoder operates at the symbol level. Although conventional 4D BI-LDPC-CM needs iterative detection and decoding for good performance, the present NB-LDPC-CM scheme completely eliminates this need for a feedback loop, which can help lower the latency and computational complexity at receivers. The system also uses non-binary LDPC codes as component codes in LDPC-coded modulation compared to binary LDPC codes that have been vastly employed in conventional bit-interleaved coded modulation schemes. The use of stronger codes like non-binary LDPC codes improves the achievable net coding gains. Additionally, the system adapts the strength of the component non-binary LDPC code according to constellation in use. Such an adaptive scheme enables us to extract most out of the potentials of the coded modulation approach. The system eliminates the iterative detection and decoding process, and hence helps reduce the latency and computational complexity at the receiver.

The foregoing detailed description is to be understood as being in every respect illustrative and exemplary, but not restrictive, and the scope of the invention disclosed herein is not to be determined from the description of the invention, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention.

What is claimed is:

1. A method for communicating signals, comprising:
   receiving a K-symbol-long input block from a $2^m$-ary source channel;
   encoding the input block into a $2^m$-ary non-binary low-density parity-check (LDPC) codeword of length N; and
   mapping each $2^m$-ary symbol to a point in a signal constellation comprised of $2^m$ points, wherein the non-binary LDPC code is used as the component code for forward error correction in a coded four-dimensional modulation scheme capable of achieving optical fiber communication at rates beyond 100 Gb/s; and
   determining a log-likelihood ratio (LLR) matrix, wherein each row k, 0≤k<N, of the LLR matrix is comprised of $2^m$ entries each corresponding to:

$$\lambda(s_k^{(a)}) = \log\left[\frac{P(s_k^{(a)}|r)}{P(s_k^{(0)}|r)}\right].$$

2. The method of claim 1, comprising matching a size of a field over which the non-binary LDPC code is designed to a size of an underlying signal constellation.

3. The method of claim 1, comprising providing an adaptive solution to coded modulation.

4. The method of claim 1, comprising providing error correction performance using non-binary LDPC codes.

5. The method of claim 4, comprising increasing the error correction performance gap with respect to the corresponding bit-interleaved LDPC-coded modulation as the underlying constellation size increases.

6. The method of claim 1, comprising operating detection and decoding units at the same symbol level to eliminate iterative detection and decoding processes.

7. The method of claim 6, comprising reducing latency and computational complexity at receivers.

8. The method of claim 1, comprising modulating mapped outputs using an optical modulator.

9. The method of claim 8, wherein the optical modulator enables four-dimensional (4D) modulations to improve power-efficiency.

10. The method of claim 8, wherein the optical modulator enables 2D or 3D modulations.

11. The method of claim 1, comprising receiving the modulated outputs.

12. The method of claim 11, comprising passing coherent detector outputs on two quadratures of two polarizations to a maximum a posteriori (MAP) detector.

13. The method of claim 12, wherein the MAP detector produces a log-likelihood ratio (LLR) matrix of size $N \times 2^m$.

14. The method of claim 13, wherein each row k, $0 \leq k < N$, of the LLR matrix is comprised of $2^m$ entries each corresponding to:

$$\lambda(s_k^{(a)}) = \log\left[\frac{P(s_k^{(a)} | r)}{P(s_k^{(0)} | r)}\right].$$

15. The method of claim 13, wherein the logarithm of the ratio of the conditional probability that the k-th symbol sent by a transmitter being the 4D constellation point $s_k^{(a)}$ corresponds to the $2^m$-ary symbol $a \in GF(2^m) = \{0, 1, \ldots, 2^m-1\}$ over the probability that it is being $s_k^{(0)}$ given the received noisy vector r.

16. The method of claim 11, comprising generating reliability estimates on each received symbol and processing the reliability estimates to determine the codeword sent by the transmitter.

17. A communication system, comprising: a transmitter to encode signals using non-binary low-density parity-check (LDPC) codes used as component codes for forward error correction in a coded four-dimensional modulation scheme capable of achieving optical fiber communication at rates beyond i00 Gb/s; and Determining a log-likelihood ration (LLR) matrix, wherein each row k, $0 \leq k < N$, of the LLR matrix is comprised of $2^m$ entries each corresponding to:

$$\lambda(s_k^{(a)}) = \log\left[\frac{P(s_k^{(a)} | r)}{P(s_k^{(0)} | r)}\right],$$

and a receiver to decode the non-binary low-density parity-check (LDPC) codes.

18. The system of claim 1, wherein the transmitter comprises:
a $2^m$-ary non-binary low-density parity-check (LDPC) encoder;
a mapper coupled to the encoder; and
a modulator coupled to the mapper.

19. The system of claim 1, wherein the receiver comprises:
a coherent detector;
a maximum a posteriori (MAP) detector coupled to the coherent detector;
a $2^m$-ary non-binary low-density parity-check (LDPC) decoder coupled to the MAP detector.

20. The system of claim 19, wherein the MAP detector produces a log-likelihood ratio (LLR) matrix of size $N \times 2^m$, where each row k, $0 \leq k < N$, of the LLR matrix is comprised of $2^m$ entries.

* * * * *